(12) United States Patent
Higashitani (10) Patent No.: US 7,737,483 B2
(45) Date of Patent: Jun. 15, 2010

(54) LOW RESISTANCE VOID-FREE CONTACTS

(75) Inventor: Masaaki Higashitani, Cupertino, CA (US)

(73) Assignee: SanDisk Corporation, Milpitas, CA (US)

(*) Notice: Subject to any disclaimer, the term of this patent is extended or adjusted under 35 U.S.C. 154(b) by 86 days.

(21) Appl. No.: 11/296,235

(22) Filed: Dec. 6, 2005

(65) Prior Publication Data

US 2007/0126028 A1 Jun. 7, 2007

(51) Int. Cl.
*H01L 29/76* (2006.01)

(52) U.S. Cl. .............. 257/314; 257/315; 257/E21.179; 257/E21.68

(58) Field of Classification Search .......... 257/E21.179, 257/E21.68, 314–316, 390; 438/427, 585–596, 438/257–267, 201, 211, 314–326
See application file for complete search history.

(56) References Cited

U.S. PATENT DOCUMENTS

| 4,203,158 | A | * | 5/1980 | Frohman-Bentchkowsky et al. .................. 365/185.29 |
| 5,043,940 | A | | 8/1991 | Harari |
| 5,070,032 | A | | 12/1991 | Yuan et al. |
| 5,095,344 | A | | 3/1992 | Harari |
| 5,172,338 | A | | 12/1992 | Mehrotra et al. |
| 5,313,421 | A | | 5/1994 | Guterman et al. |
| 5,315,541 | A | | 5/1994 | Harari et al. |
| 5,343,063 | A | | 8/1994 | Yuan et al. |
| 5,570,315 | A | | 10/1996 | Tanaka et al. |
| 5,612,254 | A | * | 3/1997 | Mu et al. .................... 438/634 |
| 5,661,053 | A | | 8/1997 | Yuan |
| 5,667,219 | A | | 9/1997 | Ishibashi |
| 5,774,397 | A | * | 6/1998 | Endoh et al. ........... 365/185.19 |
| 5,990,004 | A | | 11/1999 | Yang et al. |
| 6,046,935 | A | * | 4/2000 | Takeuchi et al. ....... 365/185.03 |
| 6,057,193 | A | * | 5/2000 | Wang et al. ................. 438/266 |
| 6,160,297 | A | * | 12/2000 | Shimizu et al. ............ 257/390 |
| 6,222,762 | B1 | | 4/2001 | Guterman et al. |
| 6,310,374 | B1 | * | 10/2001 | Satoh et al. ................ 257/298 |
| 6,455,424 | B1 | | 9/2002 | McTeer et al. |
| 6,512,262 | B2 | * | 1/2003 | Watanabe ................... 257/316 |

(Continued)

FOREIGN PATENT DOCUMENTS

EP 1 530 237 A2 5/2005

(Continued)

OTHER PUBLICATIONS

ISA/EPO, "Notification of Transmittal of the International Search Report and the Written Opinion of the International Searching Authority, or the Declaration," mailed on Jul. 10, 2007 in corresponding Int'l. App. No. PCT/US2006/061351, 13 pages.

(Continued)

*Primary Examiner*—Thanh Nguyen
(74) *Attorney, Agent, or Firm*—Vierra Magen Marcus & DeNiro LLP (57) ABSTRACT

A plug is formed by depositing a first material to partially fill an opening, leaving an unfilled portion with a lower aspect ratio than the original opening. A second material is then deposited to fill the remaining portion of the opening. The first material has good filling characteristics but has higher resistivity than the second material. The second material has low resistivity to give the plug low resistance.

18 Claims, 5 Drawing Sheets

U.S. PATENT DOCUMENTS

| | | | |
|---|---|---|---|
| 6,522,580 B2* | 2/2003 | Chen et al. | 365/185.02 |
| 6,583,479 B1* | 6/2003 | Fastow et al. | 257/390 |
| 6,797,570 B2* | 9/2004 | Shin et al. | 438/279 |
| 6,888,755 B2 | 5/2005 | Harari | |
| 6,925,007 B2 | 8/2005 | Harari et al. | |
| 6,930,001 B2* | 8/2005 | Gil | 438/258 |
| 7,045,849 B2* | 5/2006 | Chen et al. | 257/314 |
| 7,115,509 B2 | 10/2006 | Chen et al. | |
| 7,183,153 B2* | 2/2007 | Lutze et al. | 438/201 |
| 2002/0061645 A1 | 5/2002 | Trivedi et al. | |
| 2003/0098509 A1 | 5/2003 | Kamiya et al. | 257/758 |
| 2003/0111732 A1 | 6/2003 | Goda et al. | 257/758 |
| 2004/0161881 A1* | 8/2004 | Shin et al. | 438/128 |
| 2005/0266678 A1 | 12/2005 | Helm et al. | 438/637 |
| 2005/0281092 A1* | 12/2005 | Lindsay | 365/189.01 |
| 2005/0285148 A1 | 12/2005 | Chen et al. | |
| 2006/0001073 A1* | 1/2006 | Chen et al. | 257/314 |
| 2006/0152644 A1* | 7/2006 | Yi | 349/42 |
| 2006/0223279 A1* | 10/2006 | Patraw et al. | 438/427 |
| 2007/0087504 A1* | 4/2007 | Pham et al. | 438/257 |
| 2007/0126028 A1 | 6/2007 | Higashitani | |
| 2007/0128787 A1 | 6/2007 | Higashitani | 438/201 |

FOREIGN PATENT DOCUMENTS

| | | |
|---|---|---|
| JP | 10-223867 A | 8/1998 |
| TW | 546777 B | 8/2003 |
| TW | 200509257 | 3/2005 |

OTHER PUBLICATIONS

Office Action mailed Mar. 10, 2008, U.S. Appl. No. 11/296,022, filed Dec. 6, 2005.

Response to Office Action filed May 21, 2008, U.S. Appl. No. 11/296,022, filed Dec. 6, 2005.

Final Office Action dated Sep. 16, 2008 in U.S. Appl. No. 11/296,022.

Response to Office Action dated Nov. 7, 2008 in U.S. Appl. No. 11/296,022.

Office Action dated Mar. 6, 2009 in U.S. Appl. No. 11/296,022.

Response to Office Action filed Jun. 5, 2009 in U.S. Appl. No. 11/296,022.

Notice of Allowance and Fee(s) Due dated Sep. 11, 2009 in U.S. Appl. No. 11/296,022.

Taiwanese Office Action dated Oct. 22, 2009 in Taiwanese Application No. 095145418.

* cited by examiner

LOW RESISTANCE VOID-FREE CONTACTS

CROSS-REFERENCE TO RELATED APPLICATIONS

This application is related to U.S. patent application Ser. No. 11/296,022, entitled, "Method of Forming Low Resistance Void-Free Contacts," filed on the same day as the present application.

BACKGROUND

This invention relates to flash memory arrays and in particular to the structures of flash memory arrays and methods of forming them.

There are many commercially successful nonvolatile memory products being used today, particularly in the form of small form factor cards, which use an array of flash EEPROM (Electrically Erasable and Programmable Read Only Memory) cells. Such cards may be interfaced with a host, for example, by removably inserting a card into a card slot in a host. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. In an alternative arrangement to the separate card and host described above, in some examples a memory system is permanently connected to a host providing an embedded memory that is dedicated to the host.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in the following U.S. Pat. Nos. 5,070,032; 5,095,344; 5,313,421; 5,315,541; 5,343,063; 5,661,053 and 6,222,762. These patents, along with all other patents, patent applications and other publications referred to in this application are hereby incorporated by reference in their entirety for all purposes.

In a NAND array series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in the following U.S. Pat. Nos. 5,570,315; 5,774,397; 6,046,935 and 6,522,580. NAND memory devices have been found to be particularly suitable for mass storage applications such as those using removable memory cards.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon dioxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements are described in U.S. Pat. No. 6,925,007.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much, it can be shrunk. When this happens, designers will turn to a new or different layout or architecture of the circuit being implemented in order to reduce the amount of silicon area required to perform its functions. The shrinking of the above-described flash EEPROM integrated circuit systems can reach such limits.

One way to form small cells is to use a self-aligned Shallow Trench Isolation (STI) technique. This uses STI structures to isolate adjacent strings of floating gate cells such as those of NAND type memory arrays. According to this technique, a gate dielectric (tunnel dielectric) layer and floating gate polysilicon layer are formed first. Next, STI structures are formed by etching the gate dielectric and floating gate polysilicon layers and the underlying substrate to form trenches. These trenches are then filled with a suitable material (such as oxide) to form STI structures. The portions of the gate dielectric and floating gate polysilicon layers between STI structures are defined by the STI structures and are therefore considered to be self-aligned to the STI structures. Typically, the STI structures have a width that is equal to the minimum feature size that can be produced with the processing technology used. STI structures are also generally spaced apart by the minimum feature size. Thus, the portions of the gate dielectric and floating gate polysilicon layers between STI regions may also have a width that is equal to the minimum feature size. The strips of floating gate polysilicon are further formed into individual floating gates in later steps. In some examples, floating gates may have dimensions less than the minimum feature size that can be produced using photolithographic patterning alone. Examples of scheme for forming such floating gates are provided in U.S. Pat. No. 6,888,755.

In NAND and other types of nonvolatile memories, the amount of field coupling between floating gates and the control gates passing over them (the coupling ratio) is carefully controlled. The amount of coupling determines how much of a voltage that is placed on the control gate is coupled to the underlying floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343, 063. The approach described in that patent is to make the floating gates thicker than usual to provide large vertical surfaces that may be coupled with the control gates.

Individual portions of a memory array, such as strings of a NAND array, are generally connected together using conductive lines that extend across the memory array. Some conductive lines may be connected to portions of the substrate so that electrical connections are made to those portions. Generally, such connections are made by forming an opening in a dielectric layer that overlies the substrate and forming a conductive plug by filling the opening with a conductive material such as a metal or doped polysilicon. As memories shrink, the lateral dimensions of such plugs generally shrink along with other memory features. However, the vertical dimensions of such plugs may not shrink in proportion. This may be because the thickness of floating gates remains high, or for other reasons.

Figure 1:
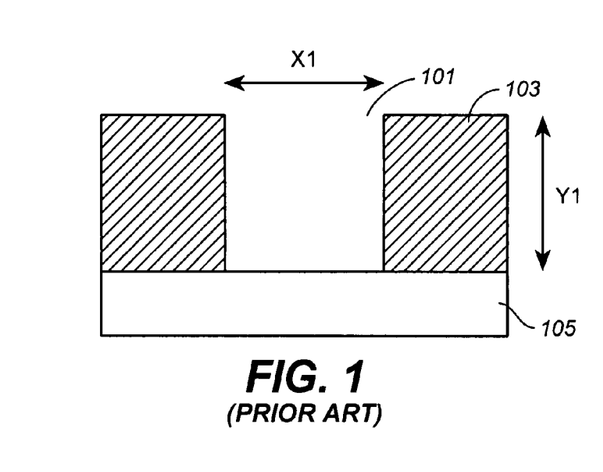
FIG. 1 shows a cross-section of an opening in a dielectric layer overlying a substrate of the prior art.

The aspect ratio of an opening is the ratio of the height of the opening to a lateral dimension. FIG. 1 shows an opening 101 in a dielectric layer 103 on a substrate 105, opening 103 having a lateral dimension (width) of X1 and a height of Y1. The aspect ratio of opening 101 is Y1/X1. In general, as memories shrink, the aspect ratios of the openings used to form contacts to the underlying substrate increase because the vertical dimensions are not reduced in proportion to the lateral dimensions. In some newer devices the width of an opening used to form a contact may be 70 nanometers or less. The thickness of the dielectric layer may be 3000 Angstroms (300 nanometers) or more.

Figure 2:
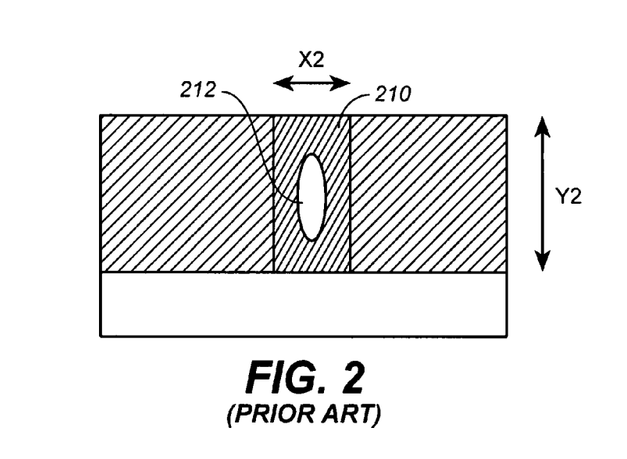
FIG. 2 shows a cross-section of a prior art plug formed in an opening, the plug containing a void.

Increasing aspect ratios present certain problems in forming good quality contacts. Plugs are generally made by depositing a conductive material so that the material fills an opening. However, where openings have high aspect ratios, the deposited material may not fill an opening fully. In some cases, voids are formed in the conductive material deposited in an opening. FIG. 2 shows an example of an opening having an aspect ratio of Y2/X2 that has conductive material deposited in it to form a plug 210. However, within plug 210, a void 212 is formed because of the depth of the opening. Deposition near the top of the opening closes the opening before the lower part is completely filled so that void 212 is incorporated in plug 210. Such voids may cause device failure by increasing the electrical resistance of the plug, preventing current flow and causing heating. Some materials have good filling characteristics that allow good quality plugs to be formed even in openings having high aspect ratios. However, some of the materials that allow void-free plugs have relatively high resistivity so that the resistance of the plug is increased, which is undesirable. Certain formation techniques also have better filling characteristics than others.

Thus, there is a need for a method of forming a conductive plug in a manner that allows void-free plug formation even with high aspect ratio openings. There is also a need for a method of forming such a plug so that it has a low overall resistance. There is also a need for a method of forming such contacts in an efficient manner as part of memory array formation. There is also a need for void-free plugs with low resistance and for memory arrays having such void-free, low resistance plugs.

SUMMARY

A composite plug is formed of a first conductive material deposited to partially fill an opening and a second conductive material that fills the remaining portion of the opening. The first material is chosen to have good filling characteristics so that no voids are formed in the first material even in an opening having a high aspect ratio. After the first material is deposited and the opening is partially filled, the remaining portion of the opening has a reduced aspect ratio. This remaining portion is then filled using a second conductive material that has low resistivity so that the plug has a low overall resistance.

The thickness of the first material is chosen so that, after the first material is deposited, the remaining portion of the opening has an aspect ratio that is calculated to be the maximum, or near the maximum that can be filled by the second material without producing voids. Thus, the thickness of the second material is made large where possible, while the thickness of the first material is made small. This provides low resistance because the resistivity of the second material is less than the resistivity of the first material.

In a NAND flash memory array, low resistance, void-free plugs may be formed at either end of a NAND string in openings having high aspect ratios. Plugs at either end may be formed simultaneously. At one end of such NAND strings, plugs are electrically connected together by a common source line. At the other end of such NAND strings, connection is made to bitlines that extend over strings.

DETAILED DESCRIPTION OF EXEMPLARY EMBODIMENTS

Figure 3A:
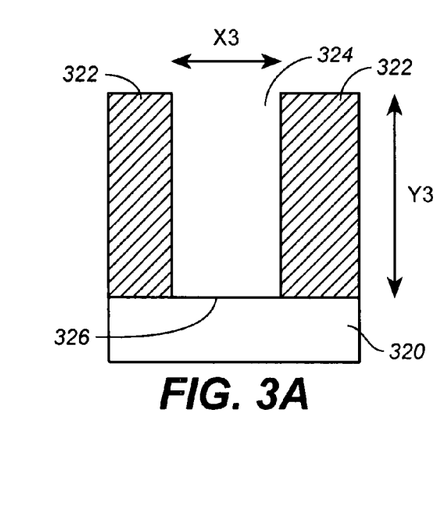
FIG. 3A shows a cross-section of a high aspect ratio opening.

FIG. 3A shows a cross-section of a portion of a substrate 320, a dielectric layer 332 overlying substrate 320 and an opening 324 in dielectric layer 322 that extends to a surface 326 of substrate 320. Opening 324 has a width of X3 and a height of Y3. Thus, the aspect ratio of opening 324 is Y3/X3.

Figure 3B:
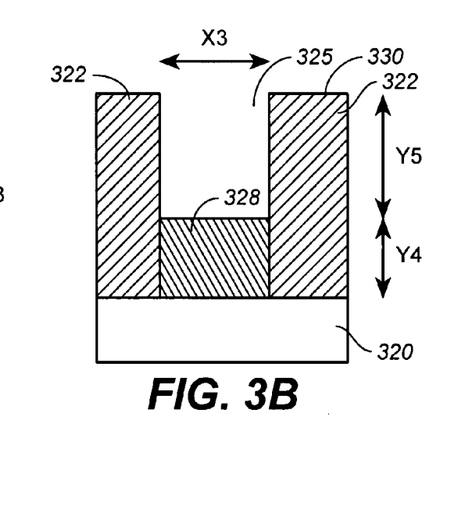
FIG. 3B shows the opening of FIG. 3A partially filled by a first conductive material, with an unfilled remaining portion.

FIG. 3B shows a cross-section of substrate 320 and dielectric layer 322 after deposition of a first conductive material to form first conductive portion 328 in opening 324. First conductive material is deposited in opening 324 to a thickness of Y4. First conductive material is generally also deposited on top surface 330 of the dielectric layer 322 during this deposition, though material on top surface 330 may subsequently be removed. Some of the first conductive material may also deposit on sidewalls of opening 324, though this is not shown in FIG. 3B. A material used as first conductive material may be chosen to provide good, void-free deposition in high aspect ratio openings even though it may have higher resistivity than other materials. In particular, first conductive material may be chosen to have adequate filling characteristics for an opening having aspect ratio Y3/X3. Doped polysilicon deposited using Low Pressure Chemical Vapor Deposition (LPCVD) or other means is an example of such a material. After first conductive portion 328 is deposited, opening 324 is filled to a height of Y4, leaving a depth of Y5 still unfilled. Thus, unfilled portion 325 of opening 324 has an aspect ratio of Y5/X3 after deposition of first conductive material. Aspect ratio Y5/X3 is less than the original aspect ratio of Y3/X3.

Figure 3C:
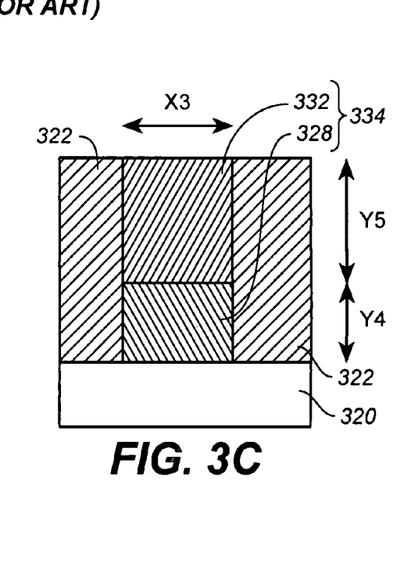
FIG. 3C shows the opening of FIG. 3B with the remaining portion filled by a second conductive material.

FIG. 3C shows a cross-section after deposition of a second conductive material to form second conductive portion 332 in the unfilled portion 325 of opening 324. The second conductive material may be chosen for its electrical properties such as low resistivity. The second conductive material has lower resistivity than the first conductive material. The second conductive material may have poorer filling characteristics than the first conductive material. For example, second conductive material may be a material that would not provide good, void free deposition if used alone to fill an opening having an aspect ratio Y3/X3. However, the second conductive material has good enough filling properties to fill unfilled portion 325 of the opening 324 after first conductive portion 328 is deposited, i.e. second conductive material can give good, void free deposition in an opening having an aspect ratio of Y5/X3. The second conductive material may be a metal, for example a refractory metal such as tungsten or some other metal such as aluminum. First conductive portion 328 and second conductive portion 332 together form a composite plug 334 that fills opening 324.

Composite plug 334 formed by first conductive portion 328 and second conductive portion 332 has lower resistance than would be provided by a plug of similar dimensions formed by the first conductive material alone. Unlike a plug formed of the second conductive material alone, composite plug 334 does not suffer from voids. Thus, there are significant advantages over plugs formed from a single material.

While opening 324 as shown FIGS. 3A-3C has smooth vertical sides, real openings may have irregular sides and may not be vertical. In particular, where an opening is formed through multiple dielectric layers, the different layers may have different etching characteristics causing some layers to be etched back further than others. An overhang may be formed where a layer is etched less than the layer below it. Such irregularities make filling an opening more difficult.

One particular application where good, low resistance, void-free plugs are desirable is in contacting substrates used in memory devices. In particular, NAND flash memory devices are rapidly becoming smaller and the aspect ratios of openings used to form plugs are increasing. It is desirable to form such plugs having a low resistance but without voids. Plugs are generally used to connect to either end of a string of memory cells in such memories. A string is formed by a series of floating gate cells connected by doped regions of the substrate.

Figure 4:
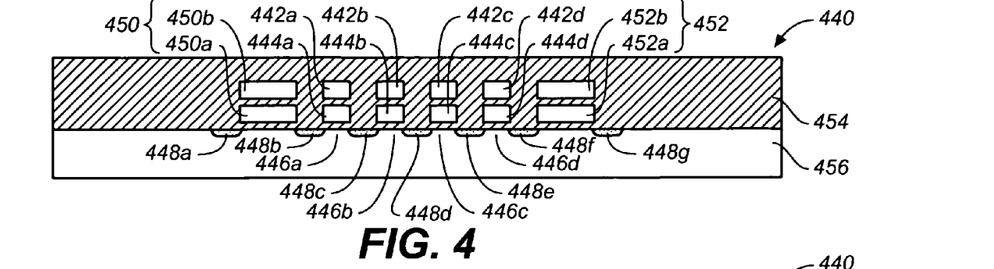
FIG. 4 shows a cross-section of a NAND string formed by floating gate cells and select gates formed over a portion of a substrate covered by a dielectric layer.

FIG. 4 shows a cross-section of an exemplary NAND string 440 at an intermediate stage of memory array fabrication. Four floating gate memory cells are formed by four control gates 442a-442d, overlying four floating gates 444a-444d, with floating gates 444a-444d overlying channel regions 446a-446d. Source and drain regions 448a-448g are shown in the substrate connecting memory cells together to form the string. A first select gate 450 is shown near one end of string 440. First select gate 450 consists of two parts 450a and 450b corresponding to floating gate and control gate layers respectively. Parts 450a, 450b are electrically connected together. First select gate 450 may be considered the drain select gate. A second select gate 452 is shown near the other end of NAND string 440. Second select gate 452 may be considered to be a source select gate. Second select gate 452 consists of two parts 452a and 452b corresponding to floating gate and control gate layers respectively. Parts 452a, 452b are electrically connected together. However, select gates are not floating, but are connected by select lines extending across the array. In an alternative arrangement, a select gate may be formed by a single conductive portion. Select gates 450, 452 are used to control the voltage applied to the memory cells of NAND string 440. A dielectric layer 454 covers floating gates 444a-444d, control gates 442a-442d and select gates 450, 452 and the underlying substrate 456. Dielectric layer 454 may consist of a single material or two or more layers of different dielectric materials, which may be deposited at different times during the formation of NAND string 440. Dielectric layer 452 may be considered a single body for electrical purposes, providing isolation for NAND string 440. A typical material used to form a dielectric layer is Boro-Phospho-Silicate Glass (BPSG). In one example, a dielectric layer is comprised of approximately 2500 Angstroms of BPSG overlying approximately 500 Angstroms of Silicon Nitride (SiN).

Figure 5:
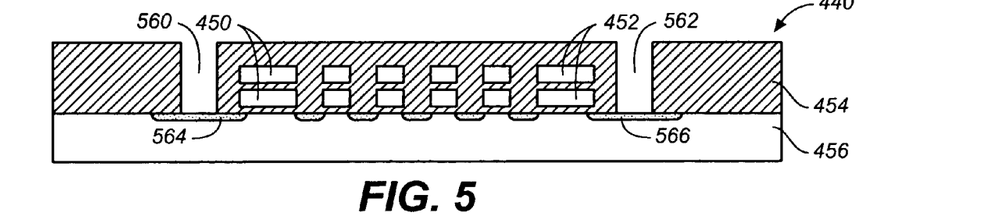
FIG. 5 shows the structure of FIG. 4 having high aspect ratio openings formed in the dielectric layer.

FIG. 5 shows NAND string 440 of FIG. 4 after formation of openings 560, 562 in dielectric layer 454. Openings 560, 562 are formed at either end of NAND string 440 at locations adjacent to source select gate 452 and drain select gate 450.

Openings 560, 562 may be formed by providing a patterned mask layer over dielectric layer 454, the mask layer having openings that are aligned to the desired locations of openings in dielectric layer 454. An anisotropic etch is then used to remove dielectric in the pattern established by the mask layer. Anisotropic etching may be Reactive Ion Etching (RIE) or another technique. Openings 560, 562 are formed so that they extend all the way to the surface of substrate 456. After openings 560, 562 are formed, impurities may be introduced into the exposed portion of the substrate. Typically, N-type impurities such as Arsenic or Phosphorous are implanted to lower the resistivity of implanted regions 564, 566 of substrate 456. Alternatively, impurities may be diffused. P-type impurities such as Boron may also be used in some cases. In some examples, no impurities are introduced at this point. Later, doped polysilicon may be deposited in openings 560, 562 and some dopant from the polysilicon diffuses into the region below the opening to provide a sufficient doping level in this area. Even where doped polysilicon is not used, implantation of dopants may not always be necessary.

Tungsten is commonly used to fill openings and form plugs to contact a substrate. Tungsten has low resistivity allowing the formation of low resistance structures and is also capable of withstanding subsequent high temperature processing. However, in some designs, particularly newer designs with smaller features, the aspect ratio of the openings may be too high to form good plugs using Tungsten. Doped polysilicon is another conductive material that may be used to fill openings and form plugs. Polysilicon deposited by LPCVD generally forms good, void-free plugs even where openings have high aspect ratios. However, polysilicon has a higher resistivity than Tungsten, so polysilicon structures have higher resistance than similar Tungsten structures. To overcome these limitations, a composite plug is formed of polysilicon and Tungsten deposited in sequence.

Figure 6:
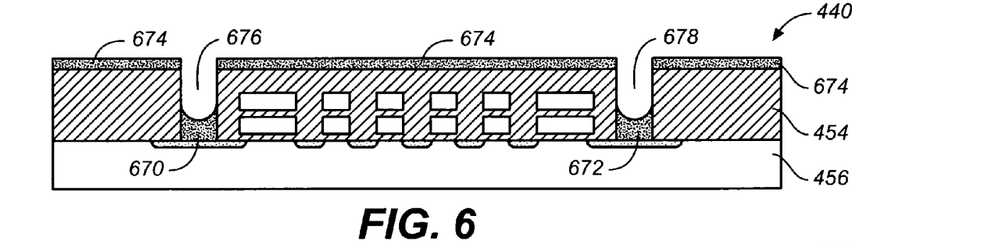
FIG. 6 shows the structure of FIG. 5 with a first conductive material deposited in the openings to partially fill the openings, leaving unfilled portions of the openings.

FIG. 6 shows NAND string 440 of FIG. 5 after deposition of a first conductive material in openings 560, 562 and across the surface of dielectric layer 454. The first conductive material forms conductive portions 670, 672 in openings 560, 562 and forms first conductive layer 674 on dielectric layer 454. The first conductive material is polysilicon in this example, though other materials may also be used. Polysilicon may be deposited in a furnace or by other suitable means. Polysilicon is doped so that it has a low resistivity. Polysilicon may be deposited so that it directly overlies substrate 456 in openings 560, 562. A clean step may be performed prior to deposition of polysilicon to remove any native oxide or other material present on substrate 456 in openings 560, 562. Deposition of polysilicon is stopped before openings 560, 562 are filled with polysilicon. Polysilicon deposition may be stopped when the thickness of first conductive portions 670, 672 in openings 560, 562 has reached a predetermined thickness. The predetermined thickness can be calculated so that remaining unfilled portions 676, 678 of openings 560, 562 have aspect ratios that allow them, to be adequately filled by tungsten.

Figure 7:
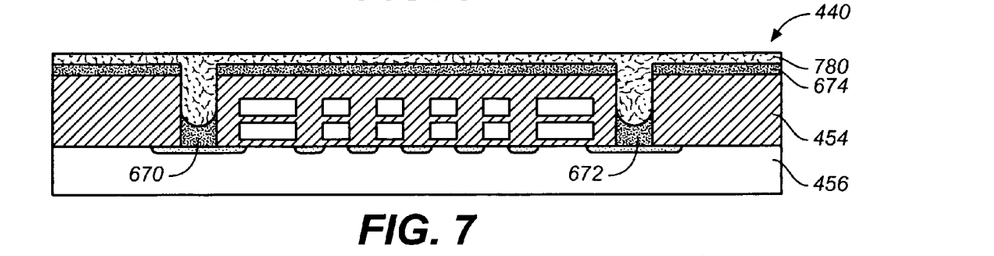
FIG. 7 shows the structure of FIG. 6 with a second conductive material deposited in the openings to fill the previously unfilled portions of the openings.

FIG. 7 shows NAND string 440 of FIG. 6 after deposition of a second conductive material to form second conductive layer 780. The second conductive material is Tungsten in this example, though other materials may also be used. The second conductive material fills the unfilled portions 676, 678 of openings 560, 562 and extends across the first conductive layer 674. Prior to deposition of Tungsten, a barrier layer (not shown) may be deposited. The barrier layer may be a composite layer, consisting of Titanium and Titanium Nitride (Ti/TiN) deposited in sequence. In other examples, the second conductive material may be deposited directly on the first conductive material or a different barrier layer may lie between the first conductive material and the second conductive material.

Figure 8:
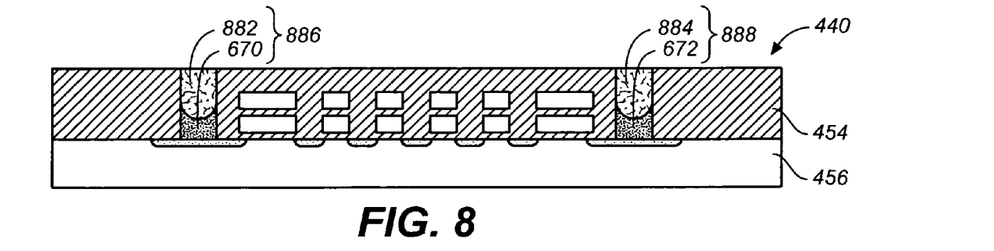
FIG. 8 shows the structure of FIG. 7 after excess first conductive material and second conductive material are removed leaving plugs in openings.

FIG. 8 shows NAND string 440 of FIG. 7 after removal of excess first and second conductive material. First conductive layer 674 is removed and second conductive layer 780 deposited over first conductive layer 674 is removed to the level of the top of dielectric layer 454, leaving second conductive portions 882, 884. First and second conductive material may be removed by Chemical Mechanical Polishing (CMP) or by etching back or other means. Typically, CMP is used because it provides a planarized surface that is desirable for subsequent steps. Remaining first conductive portions 670, 672 and second conductive portions 882, 884 form plugs 886, 888. Plugs 886, 888 have lower resistance than would be provided by plugs of polysilicon alone. Plugs 886, 888 are also void-free even though openings 560, 562 may have a higher aspect ratio than could normally be filled by Tungsten alone.

Figure 9:
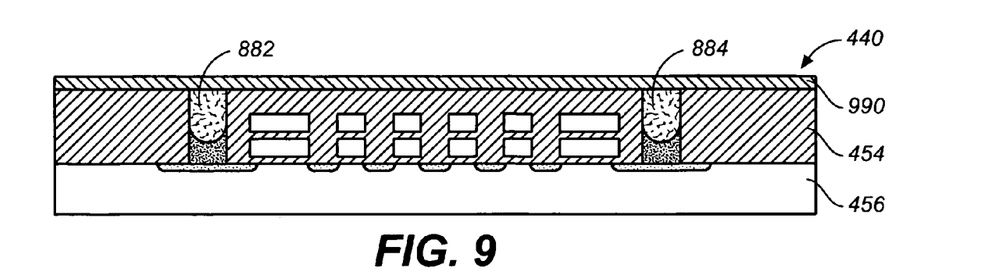
FIG. 9 shows the structure of FIG. 8 with a second dielectric layer overlying the first dielectric material and the plugs.

FIG. 9 shows NAND string 440 of FIG. 8 after deposition of a second dielectric layer 990 overlying first dielectric layer 454 and second conductive portions 882, 884. Second dielectric layer 990 of this example is a Silicon Dioxide ($SiO_2$) layer, formed by Chemical Vapor Deposition (CVD) using Tetraethyl Orthosilicate, $Si(OC_2H_5)_4$ (TEOS). Other dielectric materials may also be used.

Figure 10:
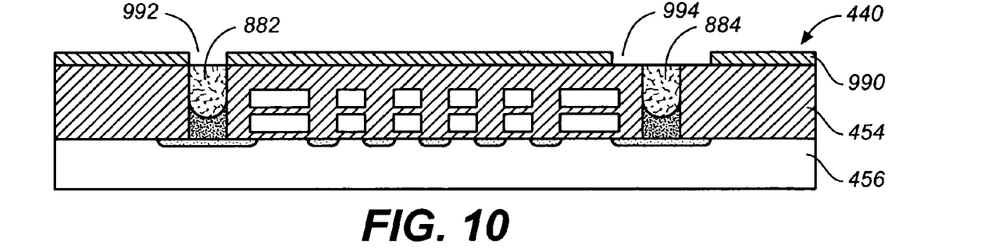
FIG. 10 shows the structure of FIG. 9 after the second dielectric layer is patterned to have openings aligned to the plugs.

FIG. 10 shows NAND string 440 of FIG. 9 after patterning of second dielectric layer 990. An opening 992 is formed in second dielectric layer 990 over second conductive portion 882. Opening 992 has roughly the same lateral dimensions as second conductive portion 882. An opening 994 is also formed in second dielectric layer 990 over second conductive portion 884. However, opening 994 extends wider than second conductive portion 884 along the direction of NAND string 440 as shown in FIG. 10. In addition, opening 994 extends in a direction perpendicular to the cross-section shown in FIG. 10 so that it overlies plugs of multiple strings. Openings 992, 994 are formed by a single process using a single mask that is aligned so that openings 992, 994 are positioned over second conductive portions 882, 884.

Figure 11:
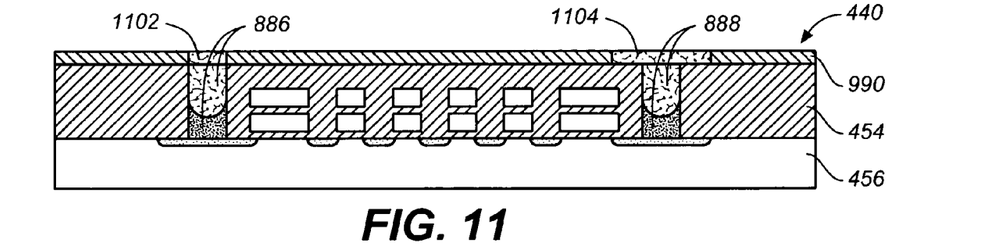
FIG. 11 shows the structure of FIG. 10 with conductive material deposited in the openings in the second dielectric layer so that drain plugs are extended and source plugs are connected together by a common source line.

FIG. 11 shows NAND string 440 of FIG. 10 after deposition and planarization of a third conductive layer to form conductive portions 1102, 1104. Generally, conductive portions 1102, 1104 are formed of the same material as second conductive portions 882, 884 (in this example—Tungsten). Drain plug 886 is extended in the vertical direction as a result of this step. Source plug 888 is connected by this step to other source contact plugs of other strings (not shown in FIG. 11) by conductive portion 1104.

Figure 12:
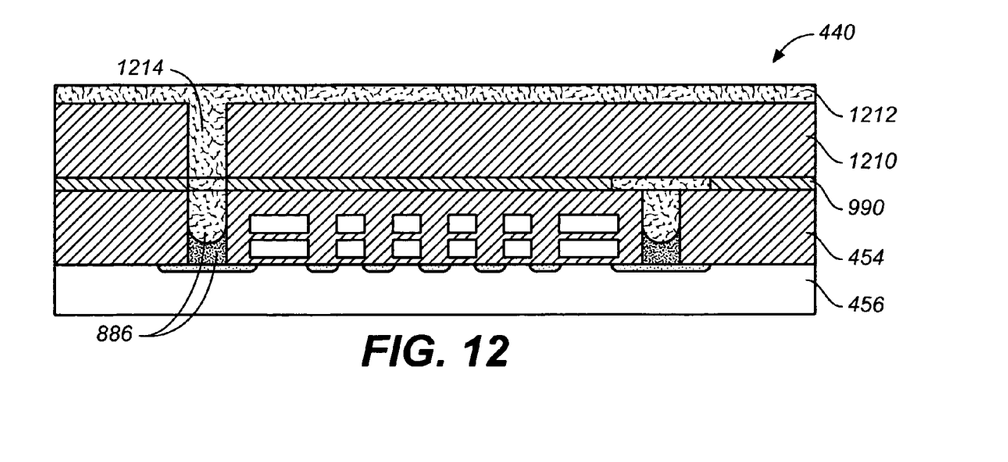
FIG. 12 shows the structure of FIG. 11 with a third dielectric layer formed over the second dielectric layer and a bitline formed over the third dielectric layer, the bitline connected to the drain side of the NAND string.

FIG. 12 shows NAND string 440 of FIG. 11 after subsequent formation of a third dielectric layer 1210, a bitline 1212 and an additional conductive portion 1214 connecting drain plug 886 to bitline 1212. Third dielectric layer 1210 may be formed of Silicon Dioxide ($SiO_2$). Third dielectric layer 1210 may be formed by High Density Plasma (HDP), plasma enhanced deposition, using TEOS or in some other manner. Additional conductive portion 1214 may be Aluminum, Copper, Tungsten or other suitable conductive material. Bitline 1212 is generally formed of a conductive material such as Aluminum or Tungsten. The combination of drain plug 886 and additional conductive portion 1214 that together connect one end of the NAND string 440 to bitline 1212 may be referred to as a "bitline contact."

Figure 13:
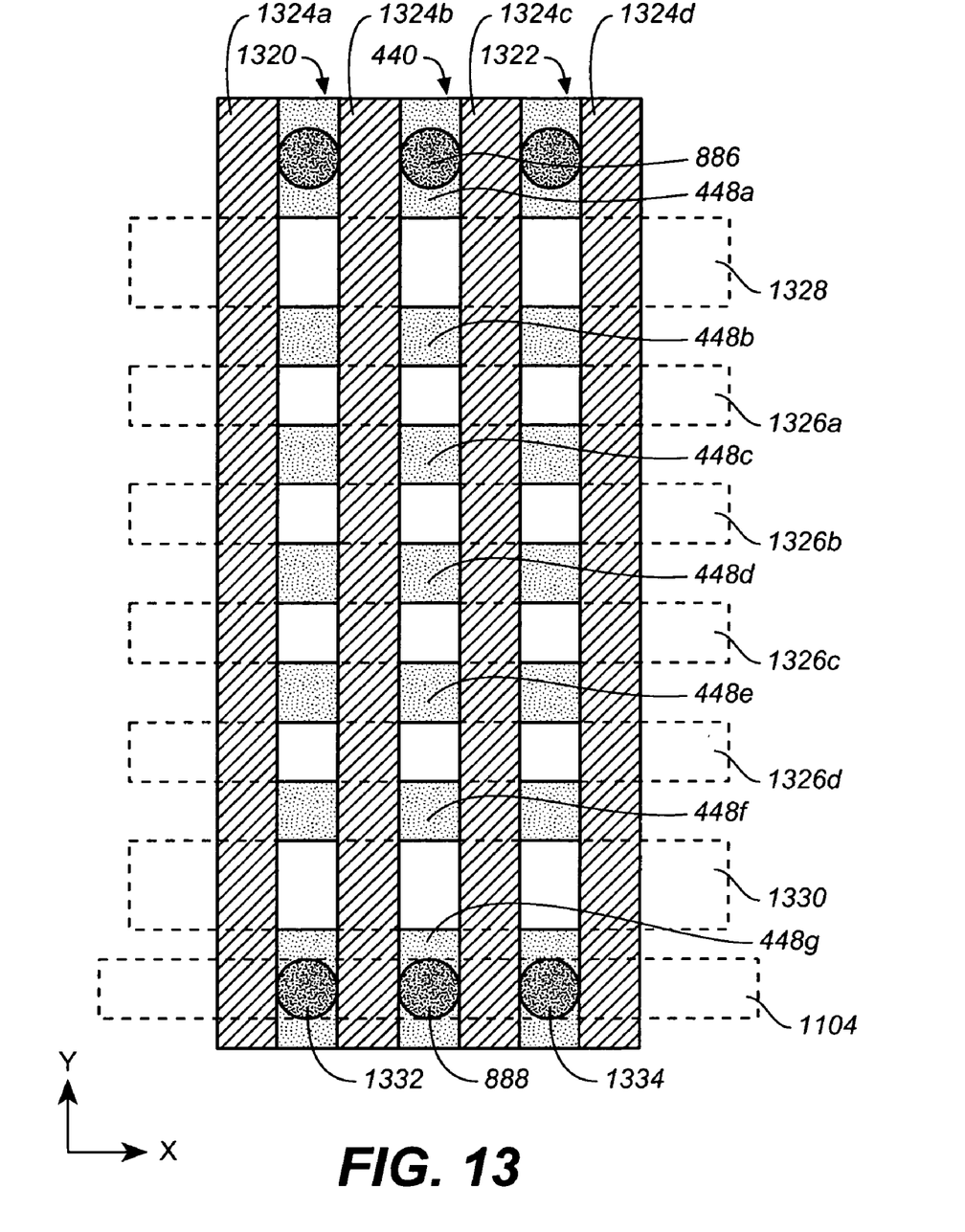
FIG. 13 shows a top-down view of the structure of FIG. 13 with strings extending in the Y-direction and wordlines, select lines and a common source line extending in the X-direction.

FIG. 13 shows a top-down view of NAND string 440 of FIG. 12 and shows additional NAND strings 1320, 1322. While three strings 440, 1320, 1322 of four floating gate cells each are shown, actual memory arrays may have 8, 16, 32 or more floating gate cells in a string and thousands of strings may extend in two dimensions across a substrate. Individual strings 440, 1320, 1322 are separated by STI regions 1324a-1324d that extend on either side of strings 440, 1320, 1324. Wordlines 1326a-1326d (indicated by broken lines) overlie floating gates of different strings forming control gates (for example, control gates 442a-442d of NAND string 440) where they overlie floating gates. Source/drain implanted regions (for example source/drain implanted regions 448a-448g of NAND string 440) in substrate 456 are shared by adjacent memory cells and provide electrical connection between memory cells of a NAND string. Select lines 1328, 1330 extend parallel to wordlines 1326a-1326d across strings 440, 1320, 1322, forming select gates (such as select gates 450, 452 of NAND string 440) where they overlie channel regions of NAND strings. Plugs 886, 888 of NAND string 440 are shown in top-down view extending from implanted regions at either end of NAND string 440. Source contact plugs 888, 1332, 1334 of NAND strings 440, 1320, 1322 are shown connected together by conductive portion 1104 (common source line) formed as shown in FIG. 11. Common source line 1104 extends parallel to wordlines 1326a-1326d and select lines 1328, 1330.

Figure 14:
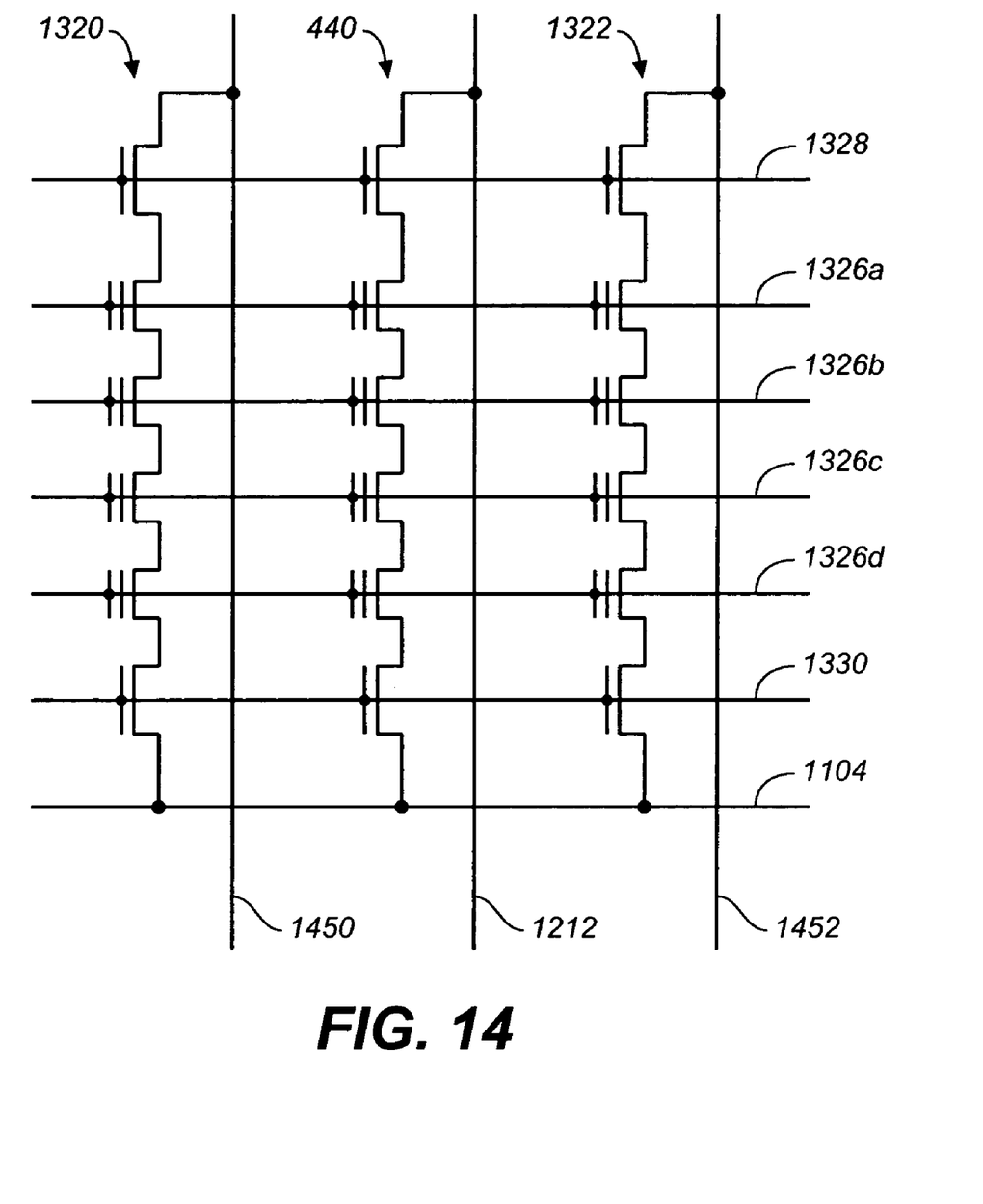
FIG. 14 shows a circuit diagram corresponding to the circuit formed by the structure of FIGS. 12 and 13.

FIG. 14 shows a circuit diagram for NAND strings 440, 1320, 1322 of FIG. 13. In addition, FIG. 14 shows bitlines 1212, 1450, 1452 (not shown in FIG. 13) extending in the same direction as NAND strings 440, 1320, 1322. Bitlines 1212, 1450, 1452 are formed over strings 440, 1320, 1322 respectively, as shown in cross-section in FIG. 12.

Although the various aspects of the present invention have been described with respect to exemplary embodiments thereof, it will be understood that the present invention is entitled to protection within the full scope of the appended claims.

The invention claimed is:

1. A nonvolatile memory array comprising:
a string of floating gate memory cells extending between a first doped region of a substrate and a second doped region of the substrate;
a dielectric material over the substrate including a plurality of layers, a first layer of the dielectric material has a top surface and bottom surface;
a first contact including a first portion of a first material and a second portion of a second material that is different than the first material, the first portion has a bottom surface that is aligned with the bottom surface of the first layer of the dielectric material, the second portion has a top surface that is aligned with the top surface of the first layer of the dielectric material, the first portion in contact with the first doped region of the substrate, the second portion overlying the first portion, the first contact is a bitline contact, the second portion is self-aligned to the first portion;
a second contact including a third portion of the first material and a fourth portion of the second material, the third portion in contact with the second doped region of the substrate, the third portion has a bottom surface that is aligned with the bottom surface of the dielectric material, the fourth portion has a top surface that is aligned with the top surface of the dielectric material, the fourth portion overlying the third portion; and
a common source line above the second contact, the second contact electrically connects to the common source line.

2. The nonvolatile memory array of claim 1 wherein the first material is doped polysilicon and the second material is tungsten.

3. The nonvolatile memory array of claim 1 further comprising shallow trench isolation structures extending along sides of the string of floating gate memory cells.

4. The nonvolatile memory array of claim 1 wherein wordlines extend across the string in a direction perpendicular to the string.

5. The nonvolatile memory array of claim 1 wherein the string of floating gate memory cells includes a first select gate and a second select gate.

6. The nonvolatile memory array of claim 1, further comprising a plurality of strings of floating gate memory cells extending between a first plurality of first doped regions of the substrate and a second plurality of second doped regions of the substrate, each of the plurality of strings having one of the first contacts connected to one of the first doped regions and one of the second contacts connected to one of the second doped regions, the common source line electrically connecting to each of the second contacts.

7. The nonvolatile memory array of claim 1 wherein the second material has a lower resistivity than the first material.

8. The nonvolatile memory array of claim 1 wherein the first portion has one or more lateral surfaces, the second portion has one or more lateral surfaces, the first layer of the dielectric material surrounds all lateral surfaces of the first portion and the second portion, the third portion has one or more lateral surfaces, the fourth portion has one or more lateral surfaces, the first layer of the dielectric material surrounds all lateral surfaces of the third portion and the fourth portion.

9. A nonvolatile memory array comprising:
a plurality of strings of floating gate memory cells, an individual string extending in a first direction between a first doped region of the substrate and a second doped region of the substrate;
a plurality of wordlines extending in a second direction that is perpendicular to the first direction and overlying floating gates of the plurality of floating gate memory cells;
a plurality of select lines extending in the second direction to connect select gates of the plurality of strings;
a dielectric region including one or more layers, a first layer of the dielectric material has a top surface and bottom surface;
a plurality of composite plugs, an individual composite plug including a first portion of a first material and a second portion of a second material that is different from the first material, the first material has a bottom surface that is aligned with the bottom surface of the first layer of the dielectric material, the second material has a top surface that is aligned with the top surface of the first layer of the dielectric material the first and second portions of the individual composite plug reside in a vertical opening in the first layer of the dielectric region with the second portion overlying the first portion, the second portion is self-aligned to the first portion, the plurality of composite plugs including a first group of composite plugs that are connected to first doped regions of the substrate and a second group of composite plugs that are connected to second doped regions of the substrate;
a common source line extending in the second direction, the common source line above the first group of composite plugs and connected to each composite plug of the first group of composite plugs; and
a plurality of bitlines extending in the first direction over the plurality of strings, an individual bitline connected to one composite plug of the second group of composite plugs.

10. The nonvolatile memory array of claim 9 wherein adjacent strings are separated by shallow trench isolation areas.

11. The nonvolatile memory array of claim 9 wherein the first material is doped polysilicon and the second material is Tungsten.

12. The nonvolatile memory array of claim 11 wherein a barrier layer extends between the first material and the second material.

13. The nonvolatile memory array of claim 12 wherein the barrier layer is a composite of Titanium and Titanium Nitride.

14. The nonvolatile memory array of claim 9 wherein the vertical opening has an aspect ratio that is too high to allow the vertical opening to be filled with the second material alone without voids in the second material.

15. The nonvolatile memory array of claim 14 wherein the thickness of the second material is as large as possible without voids in the second material.

16. The nonvolatile memory array of claim 9 wherein each of the composite plugs has one or more lateral surfaces that are defined by the vertical opening in the first layer of the dielectric region, the lateral surfaces of the composite plugs are electrically isolated from each other by the first layer of the dielectric region.

17. The nonvolatile memory array of claim 9 further comprising a plurality of conductive elements that connect respective ones of the second group of composite plugs to respective ones of the bit lines.

18. The nonvolatile memory array of claim 9 wherein the second material has a lower resistivity than the first material.

* * * * *